(12) United States Patent
Forrest et al.

(10) Patent No.: US 6,337,102 B1
(45) Date of Patent: *****Jan. 8, 2002

(54) LOW PRESSURE VAPOR PHASE DEPOSITION OF ORGANIC THIN FILMS

(75) Inventors: Stephen R. Forrest, Princeton; Paul E. Burrows, Princeton Junction; Vladimir S. Ban, Princeton, all of NJ (US)

(73) Assignee: The Trustees of Princeton University, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/972,156

(22) Filed: Nov. 17, 1997

(51) Int. Cl.⁷ .............................................. C23C 14/06
(52) U.S. Cl. ...................... 427/64; 427/66; 427/255.23; 427/255.6
(58) Field of Search .................. 427/64, 66, 255.1, 427/255.6, 255.5, 255.23; 117/925, 927

(56) References Cited

U.S. PATENT DOCUMENTS

| | | | |
|---|---|---|---|
| 3,379,803 A | 4/1968 | Tittmann et al. ............... | 264/81 |
| 4,664,063 A | 5/1987 | Ashizawa et al. | |
| 4,681,773 A | 7/1987 | Bean ........................... | 427/38 |
| 4,788,082 A | * 11/1988 | Schmitt | |
| 4,913,865 A | * 4/1990 | Toyotama | |
| 5,039,657 A | 8/1991 | Goldman et al. ............... | 505/1 |
| 5,080,928 A | * 1/1992 | Klinedinst et al. | |
| 5,174,881 A | 12/1992 | Iwasaki et al. | |
| 5,334,250 A | 8/1994 | Mikami et al. ............. | 118/724 |
| 5,431,958 A | 7/1995 | Desu et al. ............... | 427/255.3 |
| 5,433,784 A | 7/1995 | Miyagi et al. | |

(List continued on next page.)

FOREIGN PATENT DOCUMENTS

| | | |
|---|---|---|
| EP | 0 702 505 | 3/1996 |
| EP | 0 761 841 | 3/1997 |
| GB | 2 211 209 | 6/1989 |
| JP | 63-45362 | * 2/1988 |
| JP | 06-279991 | * 10/1994 |
| WO | 96/19792 | * 7/1996 |
| WO | 97/48115 | 12/1997 |
| WO | 97/48139 | 12/1997 |

OTHER PUBLICATIONS

Bunshah et al., Deposition Technologies for Films and Coatings, Noryes Publications, Park Ridge new Jersey, p. 85, 1982 (no month).*

Forrest et al, "Intense Second Harmonic Generation and Long–Range Structural Ordering in Thin Films of an Organic Salt Grown by Organic Vapor Phase Deposition," 68 Appl. Phys. Lett. 132 (1996). (no month).

Burrows et al, "Organic Vapor Phase Deposition: a New Method for the Growth of Organic Thin Films with Large Optical Non–linearities," 156 J. Of Crystal Growth 91 (1995). (no month).

C. W. Hutchings, et al., "Apparatus for chemical vapor deposition of polyimide films", *Review of Scientific Instruments*, vol. 66, No. 7, Jul. 1, 1995, pp. 3943–3947.

*Primary Examiner*—Timothy Meeks
(74) *Attorney, Agent, or Firm*—Kenyon & Kenyon

(57) ABSTRACT

Methods for preparing organic thin films on substrates, the method comprising the steps of providing a plurality of organic precursors in the vapor phase, and reacting the plurality or organic precursors at a sub-atmospheric pressure. Also included are thin films made by such a method and apparatuses used to conduct such a method. The method is well-suited to the formation of organic light emitting devices and other display-related technologies.

43 Claims, 5 Drawing Sheets

U.S. PATENT DOCUMENTS

| | | | |
|---|---|---|---|
| 5,457,565 A | * 10/1995 | Namiki et al. | |
| 5,534,314 A | * 7/1996 | Wadley et al. | |
| 5,554,220 A | * 9/1996 | Forrest et al. | 117/88 |
| 5,670,212 A | * 9/1997 | Staring et al. | 427/255.6 |
| 5,703,436 A | 12/1997 | Forrest et al. | |
| 5,707,745 A | 1/1998 | Forrest et al. | |
| 5,757,026 A | 5/1998 | Forrest et al. | |
| 5,757,139 A | 5/1998 | Forrest et al. | |
| 5,811,833 A | 9/1998 | Thompson | |
| 5,834,893 A | 11/1998 | Bulovic et al. | |
| 5,844,363 A | 12/1998 | Gu et al. | |
| 5,861,219 A | 1/1999 | Thompson et al. | |
| 5,874,803 A | 2/1999 | Garbuzov et al. | |
| 5,917,280 A | 6/1999 | Burrows et al. | |
| 5,932,895 A | 8/1999 | Shen et al. | |
| 5,981,306 A | 11/1999 | Burrows et al. | |
| 5,986,401 A | 11/1999 | Thompson et al. | |
| 5,998,803 A | 12/1999 | Forrest et al. | |
| 6,013,982 A | 1/2000 | Thompson et al. | |
| 6,030,715 A | 2/2000 | Thompson et al. | |
| 6,045,930 A | 4/2000 | Thompson et al. | |
| 6,046,543 A | 4/2000 | Bulovic et al. | |
| 6,048,630 A | 4/2000 | Burrows et al. | |
| 6,091,195 A | 7/2000 | Forrest et al. | |
| 6,111,902 A | 8/2000 | Kozlov et al. | |
| 6,125,226 A | 9/2000 | Forrest et al. | |

* cited by examiner

LOW PRESSURE VAPOR PHASE DEPOSITION OF ORGANIC THIN FILMS

GOVERNMENT RIGHTS

This invention was made with Government support under Contract No. F49620-92-J-05 24 (Princeton University), awarded by the U.S. Air Force OSR (Office of Scientific Research). The Government has certain rights in this invention.

FIELD OF THE INVENTION

The present invention relates to the fabrication of optical quality thin films, and more particularly to the low pressure fabrication of such thin films for application in non-linear optical devices and organic light emitting devices.

BACKGROUND OF THE INVENTION

The field of organic electroluminescence is a rapidly growing technology. Spurred by potential application to displays, organic light emitting devices (OLEDs) are capable of achieving external quantum efficiencies of over 3%, and operational lifetimes on the order of 10,000 hours at video brightness. Both small molecule and polymer-based OLEDs are known, but polymer-based devices have a general advantage of simple and inexpensive fabrication by spin-on deposition techniques. In contrast, small molecule devices are usually fabricated by thermal evaporation in vacuum, which is usually a more expensive process than spin-on deposition. Examples of OLED structures and processing techniques are provided in published PCT application WO 96/19792, incorporated herein by reference.

The use of organic vapor phase deposition (OVPD) has made progress towards the low cost, large scale deposition of small molecular weight organic layers with numerous potential photonic device applications such as displays. The OVPD process is described in U.S. Pat. No. 5,554,220 to Forrest et al.; S. R. Forrest et al., "Intense Second Harmonic Generation and Long-Range Structural Ordering in Thin Films of an Organic Salt Grown by Organic Vapor Phase Deposition," 68 Appl. Phys. Lett. 1326 (1996); and P. E. Burrows et al., "Organic Vapor Phase Deposition: a New Method for the Growth of Organic Thin Films with Large Optical Non-linearities," 156 J. of Crystal Growth 91 (1995), each of which is incorporated herein by reference.

The OVPD process uses carrier gases to transport source materials to a substrate, where the gases condense to form a desired thin film. The OVPD technique has been used, for example, to deposit films of the optically non-linear organic (NLO) salt, 4'-dimethylamino-N-methyl-4-stilbazolium tosylate (DAST), from volatile precursors 4'-dimethylamino-N-methyl-4-stilbazolium iodide (DASI) and methyl p-toluensulfonate (methyltosylate, MT), which are transported by carrier gases to a heated substrate. In this process, DASI thermally decomposes to form 4-dimethylamino-4-stilbazole (DAS), which subsequently reacts with MT to form DAST on the substrate.

Because of its capability for controlled co-deposition of materials with radically different vapor pressures, OVPD is believed to be the only method for the precise stoichiometric growth of multi-component thin films. However, the OPVD process is conducted at atmospheric pressure, and films grown at or near atmospheric pressure are often rough and have non-uniform surface morphologies due to gas phase nucleation and a diffusion-limited growth process.

SUMMARY OF THE INVENTION

The present invention makes use of low pressure deposition techniques to produce organic thin films having superior surface properties. In one aspect, the present invention comprises a method for preparing an organic thin film on a substrate, the method comprising the steps of providing a plurality of organic precursors, the organic precursors being in the vapor phase; and reacting the plurality of organic precursors at a sub-atmospheric pressure in the presence of the substrate to form a thin film on the substrate. In another aspect, the present invention includes organic films made by such a method. In yet another aspect, the present invention includes an apparatus designed to facilitate the reaction of organic precursors at sub-atmospheric pressures to form an organic film on a substrate.

One advantage of the present invention is that it provides multi-component organic thin films wherein the amount of each component in such films can be controlled accurately and precisely.

Another advantage of the present invention is that it provides uniform organic thin films having smooth surfaces.

Another advantage of the invention is that it provides a low pressure organic vapor phase deposition method and apparatus for the growth of thin films of organic light emitting materials and optically non-linear organic salts.

Another advantage of the invention is that it provides a low pressure organic molecular beam deposition method and apparatus for the formation of thin films of organic light emitting materials and optically non-linear organic salts.

Yet another advantage of the invention is that it provides a method and apparatus for the uniform deposition of organic materials over large substrate areas.

DETAILED DESCRIPTION

The present invention provides a method and apparatus for the growth of organic thin films on substrates while under sub-atmospheric pressures. The method of the invention is herein identified as low pressure organic vapor deposition (LPOVPD). The LPOVPD method of the present invention allows for the accurate and precise control of the deposition of multi-component organic thin films. In addition, the thin films of the present invention are characterized by superior surface properties such as low surface roughnesses.

Figure 1:
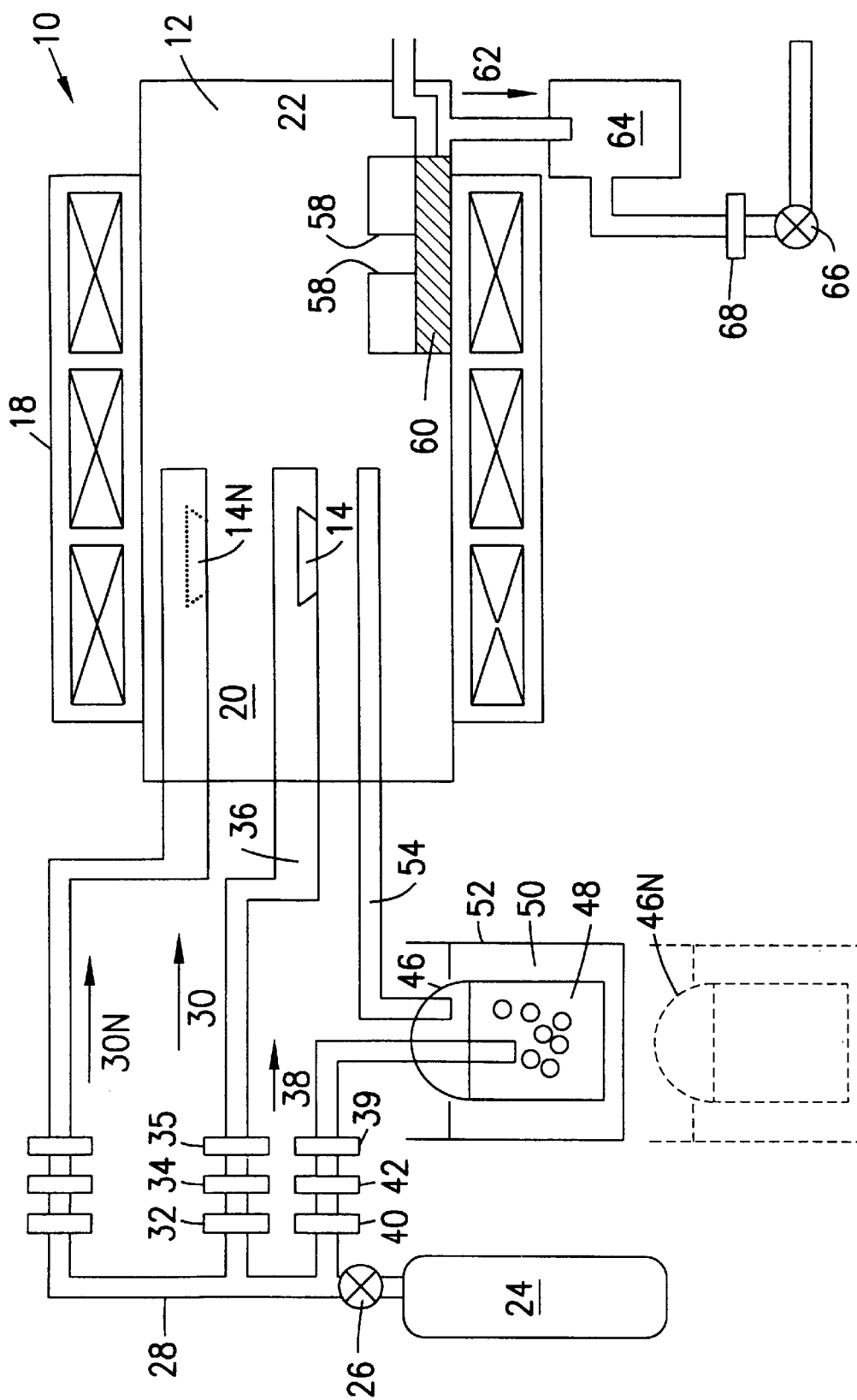
FIG. 1 shows a LPOVPD reactor, in accordance with an embodiment of the present invention.

A LPOVPD reactor 10 in accordance with an embodiment of the present invention is schematically shown in FIG. 1. Reactor 10 includes a reaction chamber, such as a reactor tube 12, and tubing extending into the reaction chamber. Reactor tube 12 is a cylinder having a suitable dimension such as, for example, a diameter of 10 cm and an approximate length of 45 cm in an experimental apparatus. Reactor tube 12 is made of any suitable material such as glass or quartz. An open container such as crucible 14 contains a first organic precursor material and is placed within tube 36 near one end 20 of the reactor tube 12. Alternatively, crucible 14 is placed directly on the reactor tube 12 or on shelves or tubes therein. Crucible 14 is heated or cooled by means of a multi-zone heater/cooler 18, which substantially surrounds reactor tube 12. The temperature control of crucible 14 results in the thermal decomposition or volatilization of the first organic precursor material within crucible 14. A regulated stream 30 of inert carrier gas is passed through tube 36 and into the reaction chamber, thus causing vapor of the first organic precursor to flow along the reactor tube 12 toward its exhaust end 22. The inert carrier gas is an inert gas such as nitrogen, helium, argon, krypton, xenon, neon and the like. Gases with a reducing character, such as hydrogen, ammonia and methane, are also inert for many organic materials. Use of these reducing gases often has the additional benefit of assisting in the burning of undesired excess reactants.

Inert gas is delivered from tank 24 through a regulator valve 26 and into tubing 28 for delivery through at least two flow paths, 30 and 38, and into reactor tube 12. One flow path 30 includes a series connected pressure regulator 32, flow meter 34 and quick switching valve 35 from which the carrier gas is delivered into end 20 of reactor tube 12. The second flow path 38 includes a series connected pressure regulator 40, flow meter 42 and quick switching valve 39 from which the carrier gas flows into a bubbler 46, which contains a second organic precursor material 48. To facilitate the temperature control of second organic precursor material 48, bubbler 46 is partially immersed in bath 50 within container 52. Inert gas from tank 24 bubbles through the second organic precursor 48 and through tubing 54 to carry vapor of the second organic precursor 48 into reactor tube 12. During this process, tube 54 must be maintained at a sufficiently high temperature to avoid recondensation of the volatilized second organic precursor 48 as it travels from the bubbler to the reactor.

The amount of any precursor entering reactor tube 12 is controlled by processing parameters such as the temperature and flow rate of the carrier gas and the temperature of the reactants. The LPOVPD method provides precise metering of the precursors or reactants independently of their vapor pressure or chemical nature using pressure mass flow controllers. The present method thus permits the combination of materials with widely different characteristics in ratios necessary for the production of desired films.

The precursor streams are capable of being turned on and off almost instantly by employing quick switching valves 35 and 39. These valves direct the precursor streams into reactor 12 or into a by-pass line (not shown), so that at any given time, different precursor streams may be entering the reactor 12 for the deposition of films of different compositions and characteristics. Valve 39 also regulates the admittance of carrier gas into bubbler 46. Valves 35 and 39 thus allow the rapid change of reactant streams entering the reactor 12, for changing the nature and the composition of the grown films. It is thus possible, for example, to grow ABAB, ABCABC, ABABCAB, and ABCDABCD-type films, where each letter denotes a different molecular layer or composition.

A vacuum pump 66 and control throttle valve 68 are attached to reactor 10 at the exhaust 62. Most of the organic vapors not deposited onto substrate 58 are condensed in a trap 64 placed upstream from pump 66. Trap 64 contains liquid nitrogen or a neutral, fluorocarbon oil, for example. Throttle valve 68 regulates the pressure in reactor 10. An appropriate pressure gauge is connected to the reactor (not shown) with electronic feedback to the control throttle valve 68 to maintain a desired pressure in the reactor.

Vacuum pump 66 provides a pressure of about 0.001–100 Torr in reactor tube 12. The actual pressure for any combination of acceptor, donor, and single component layers is experimentally determined with reference to the temperatures required to volatilize the precursor materials, the wall temperature to prevent condensation of the precursor materials, and the reaction zone temperature gradient. The optimal choice of pressure is unique to the requirements of each deposited organic layer. For example, optimal pressures for the deposition of single component layers such as tris-(8-hydroxyquinoline) aluminum ($Alq_3$) or N-N'-diphenyl-N,N-bis(3-methylphenyl) 1,1'-biphenyl-4,4' diamine(TPD) are about 0.1–10 Torr.

The substrates on which the thin films of the present invention are deposited are typically selected from those materials that are commonly encountered in semiconductor and optics manufacturing. Such materials include, for example, glass, quartz, silicon, gallium arsenide and other III–V semiconductors, aluminum, gold and other precious and non-precious metals, polymer films, silicon dioxide and silicon nitride, indium-tin-oxide and the like. For high quality optical thin films, it is preferable to use substrates that provide crystalline interactions with the deposited organic film to induce epitaxial growth. To achieve such epitaxial growth, it is often necessary to coat substrates with non-polar organics having crystalline structures similar to the film to be deposited.

In addition, as an organic thin film is deposited onto substrate 58, it is often desirable to control the temperature of the substrate. Independent control of substrate temperature is accomplished, for example, by contacting substrate 58 with temperature-control block 60, which has channels therein for the circulation of materials such as water, gas, Freon, glycerin, liquid nitrogen, and the like. It can also be heated by the use of resistance or radiant heaters positioned on or near the block 60.

Reactor 10 of FIG. 1 is expandable to include multiple bubblers 46N to feed additional precursors into reactor 10. Similarly, multiple carrier gas flow paths 30N are used to deliver yet additional precursors from crucibles 14N. As an alternative, crucibles 14, 14N are vertically stackable on shelves or in tubes within reactor tube 12 for processing the additional precursors. Depending on the organic film to be deposited, one or more flow paths 30, 38 are used alone or in any combination to provide the necessary precursor materials.

The method of the present invention is used to deposit a wide variety of organic thin films from the reaction of vapor precursors. As used herein, "reaction" refers to a chemical reaction in which precursor reactants form a distinct reaction product, or alternatively, it merely refers to a combination or mixture of precursor materials, or where precursor materials form a donor-acceptor or quest-host relationship. For example, in accordance with the present invention, the following NLO materials are formed as thin films by the reaction of the listed precursors:

| Film Material | First Precursor | Second Precursor |
|---|---|---|
| 4'-dimethylamino-N-methyl-4-stilbazolium tosylate (DAST) | 4'-dimethylamino-4-stilbazole (DAS) | methyl tosylate (MT) |
| 4'-dimethylamino-4- | methyl methane- | 4'-dimethylamino-4- |

-continued

| Film Material | First Precursor | Second Precursor |
| --- | --- | --- |
| methylstilbazolium methanesulfonate (DASM) | sulfonate (MM) | stilbazole (DAS) |
| 4'-dimethylamino-4-methylstilbazolium trifluoromethanesulfonate (DASM$_f$) | methyl trifluoro-methanesulfonate (M$_f$M) | 4'-dimethylamino-4-stilbazole (DAS) |
| 4'-dimethylamino-4-methyl-4-stilbazolium tosylate (DAST) | methyl tosylate (MT) | 4'-dimethylamino-4-methylstilbazolium thiophenoxide (DASTh) |
| 4'-methoxy-4-methylstilbazolium tosylate (MeOST) | methyl tosylate (MT) | 4'-methoxy-4-methylstilbazole (MeOS) |
| 4'-dimethylamino-N-methyl-4-stilbazolium tosylate (DAST) | methyl tosylate (MT) | 4'-dimethylamino-4-ethylstilbazolium iodide (DAS(Et)I) |
| 4'-dimethylamino-N-methyl-4-stilbazolium tosylate (DAST) | methyl tosylate (MT) | 4'-dimethylamino-4-ethylstilbazolium hydroxide (DAS(Et)OH) |
| 4'-dimethylamino-N-acetylstilbazolium tosylate (DAAST) | acetyl toluene-sulfonate (AT) | 4'-dimethylamino-4-stilbazole (DAS) |
| 4'-dimethylamino-N-methylstilbazolium trifluoroacetate (DASA$_f$) | methyl trifluoro-acetate (MA$_f$) | 4'-dimethylamino-4-stilbazole (DAS) |

In another example relating more specifically to light emitting materials used to make OLEDs, the precursors consist of, for example, tetrathisferlvalene (TFF) and 7,7,8,8-tetracyanoquinodimethane (TCNQ). The mixing step results in the charge transfer complex TTF-TCNQ which deposits onto a substrate. In another example relating to OLEDs, 4-(dicyanomethylene)-2-methyl-6-(p-dimethylaminostyryl)-4H-pyran (DCM) is added into a high flow rate carrier gas stream while Alq$_3$ is added into a lower flow rate carrier gas stream. These streams are then mixed in a central reactor tube, thus providing the desired dilution of the guest molecule in the host matrix film to form a single luminescent layer. Other guest molecule examples in Alq$_3$ hosts are 5,10,15,20-tetraphenyl-21H,23H-porphine (TPP), Rubrene, DCM2, Coumarin, etc. As a variation, multiple dopants can be added into a single host to achieve efficient broad color conversion.

In another example, a bilayer light emitting device consisting of a hole transporting layer ("HTL") such as TPD; α-4,4'-bis[N-(1-naphthyl)-N-Phenyl-amino] biphenyl (α-NPD); or MTDATA, layered onto the surface of a light emitting layer ("EL") such as Alq$_3$, bis-(8-hydroxyquinoline) aluminum oxyphenyl ((Alq$_2$)'-OPh) or doped combinations of these layers, is grown by sequentially growing the HTL and EL to desired thicknesses. This is followed by growing additional layers onto the organics, or by growth on metallic contact layers using organometallic sources such as trimethyl-indium, trimethyl-gallium, and the like.

Figure 2:
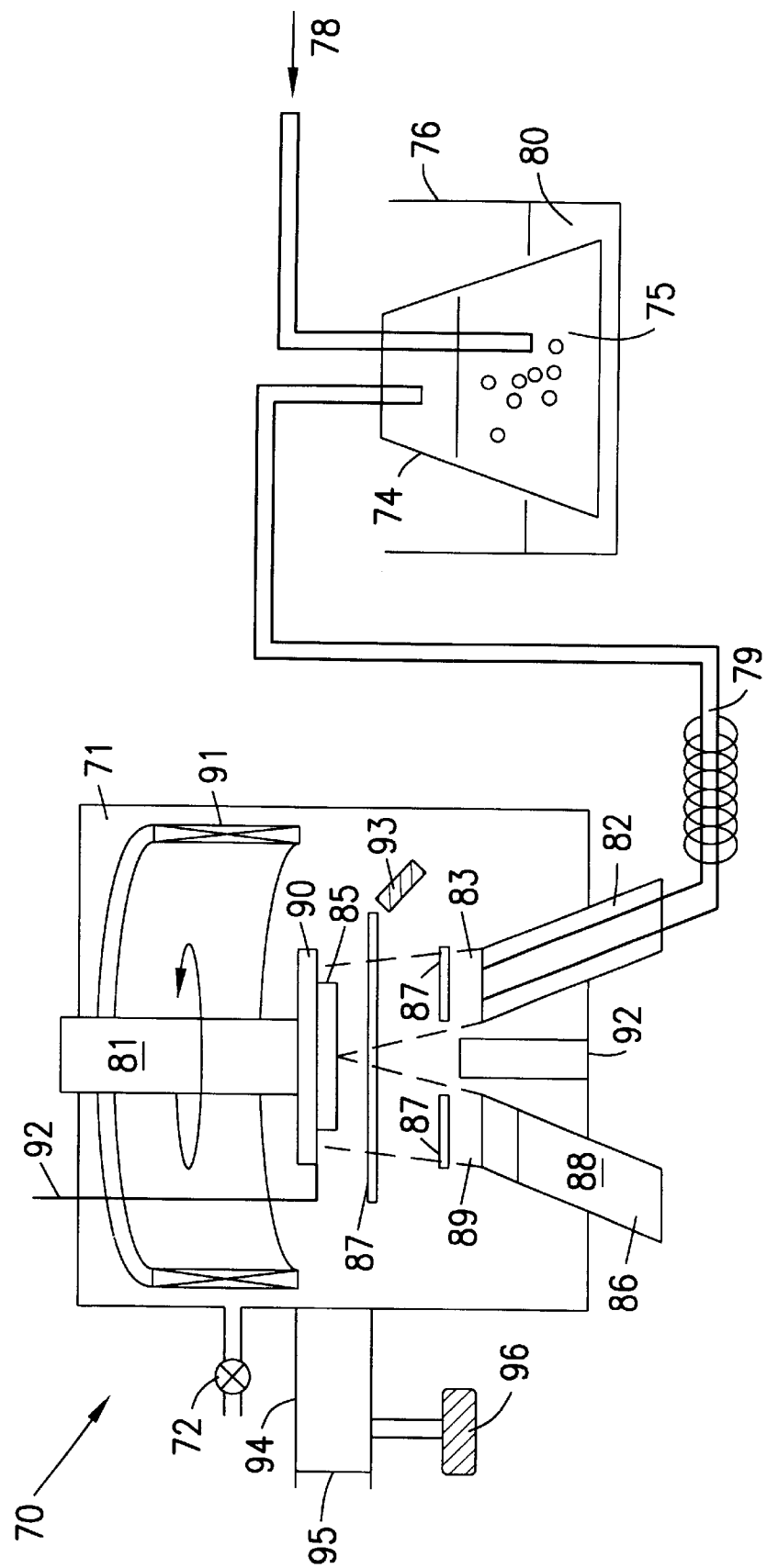
FIG. 2 shows an OMVD reactor, in accordance with an embodiment of the present invention.

In addition to the apparatus and method described with reference to FIG. 1, the present invention includes a low pressure reactor 70 and method as shown in FIG. 2. Reactor 70 includes a modified ultra-high vacuum chamber 71 and a vacuum pump such as a turbomolecular pump (not shown) connected to valve 72. Typical chamber base pressures in chamber 71 are $10^{-8}$–$10^{-11}$ Torr. The process of depositing organic layers with the use of reactor 70 is called organic molecular beam vapor deposition (OMVD). Although both LPOVPD and OMVD make use of sub-atmospheric pressures for the deposition of organic layers, the principle difference between these processes is that in the latter, the molecular mean free path is comparable to or larger than the dimensions of the chamber 70. In comparison, the mean free path in LPOVPD is significantly shorter than the gas reactor dimensions. OMVD thus allows for the formation of highly directed molecular "beams" from the injectors to the substrate, allowing for precise kinetic control of the grown film thickness, purity and morphology.

Bubbler 74 is included for containing a first precursor material 75. The bubbler 74 is placed into container 76 and immersed in a temperature controlled bath 80. A high purity inert carrier gas 78 bubbles through first precursor 75, and carries respective vapors through heated tubing 79 and into vacuum chamber 71 by way of injector 82. Once inside chamber 71, the precursor vapors form a molecular beam 83 that impinges on substrate 85. Substrate 85 is provided with a means for providing temperature control such as coolant port 81, for example.

Vacuum chamber 71 optionally is provided with at least one Knudsen or K-cell 86, which contains a second precursor material 88. K-cell 86 is a uniformly heated and controlled oven for the effusion of evaporants under vacuum. For example, K-cell 86 is heated to crack DASI or other precursor and sublime the resulting DAS, such that it is injected into reactor 70 as a molecular beam 89. Alternatively, K-cell 86 simply sublimes a single component substance such as Alq$_3$ Alternatively, K-cell 86 is fitted with a carrier gas inlet used to dilute the concentration of the molecular species being sublimed or evaporated into the gas stream by thermalization. This dilution process is particularly useful in achieving precise doping levels of guest-host systems such as DCM-Alq$_3$ by controlling the temperatures of bath 80 and Knudsen cell 86 as well as the flow of carrier gas 78 to bubbler 74.

Molecular beams 83 and 89 impinge on substrate 85 to deposit an organic thin film, the thickness of which is monitored by quartz crystal 93. Sample holder 90 rotates to ensure a uniform deposition and reaction of precursor materials. The deposition of precursor materials is further controlled by shutters 87, which are used to interrupt molecular beams 83 and 89.

Reactor 70 also optionally includes a cooled shroud 91 to help keep the pressure of vacuum chamber 71 to a minimum for re-evaporated precursor materials. Also preferably included is a partition 92 to keep precursor materials from migrating and thus contaminating each other.

Reactor 70 is embellished with many of the same attributes of the LPOVPD reactor shown in FIG. 1, such as quick switching valves, bypass lines and the like. Reactor 70 is able to be fitted with multiple Knudsen cells and bubblers for the deposition of multiple precursor materials onto substrate 85. Reactor 70 also preferably includes a "load-lock" 94 for sample introduction. Load-lock 94 includes door 95 and vacuum pump 96, and provides for the exchange of samples without compromising the pressure of chamber 71.

Figure 3:
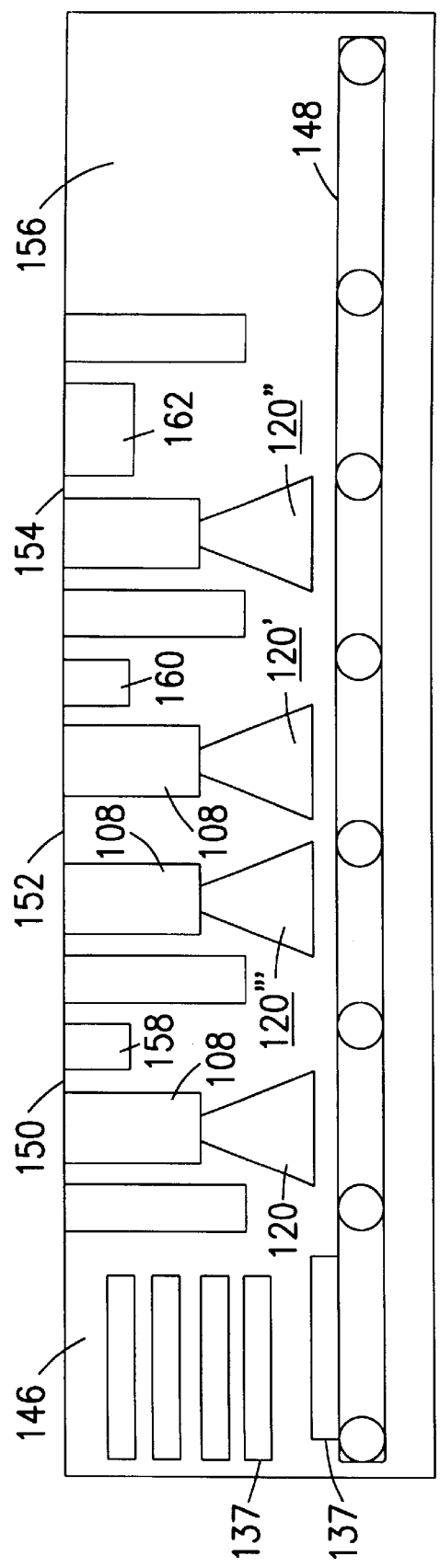
FIG. 3 shows an apparatus for the continuous low pressure deposition of organic materials onto substrates, in accordance with an embodiment of the present invention.

The apparatus of FIG. 1 is optionally modified for the continuous deposition of organic layers on large area substrates, as shown by the example illustrated in FIG. 3. The apparatus of FIG. 3 includes a plurality of vacuum chambers such as loading chamber 146, organic layer deposition chambers 150 and 152, contact deposition chamber 154, and unload chamber 156. As an example, each deposition chamber is a LPOVPD reactor 10 of FIG. 1. The substrates 137 are transported on a conveyor belt 148 through each of chambers 150, 152, 154 and 156. In the embodiment shown in FIG. 3, chambers 150, 152 and 154 include sources 158, 160 and 162, respectively, of radiant heat to prevent the condensation of organic vapors. Although only two organic layer deposition chambers 150 and 152 are shown in FIG. 3, additional chambers are included as desired. In passing from the loading chamber 146 to the organic layer deposition chambers 150 and 152, and from the contact deposition chamber 154 to the unload chamber 156, the substrate 137 passes through air locks (not shown) so as not to compromise the vacuum in the chambers 150, 152, and 154. As an example relating to OLEDs, chambers 150 and 152 are used for the deposition of TPD and $Alq_3$, respectively, and chamber 154 is used for the deposition of an Mg:Ag contact layer.

Figures 4A, 4B:
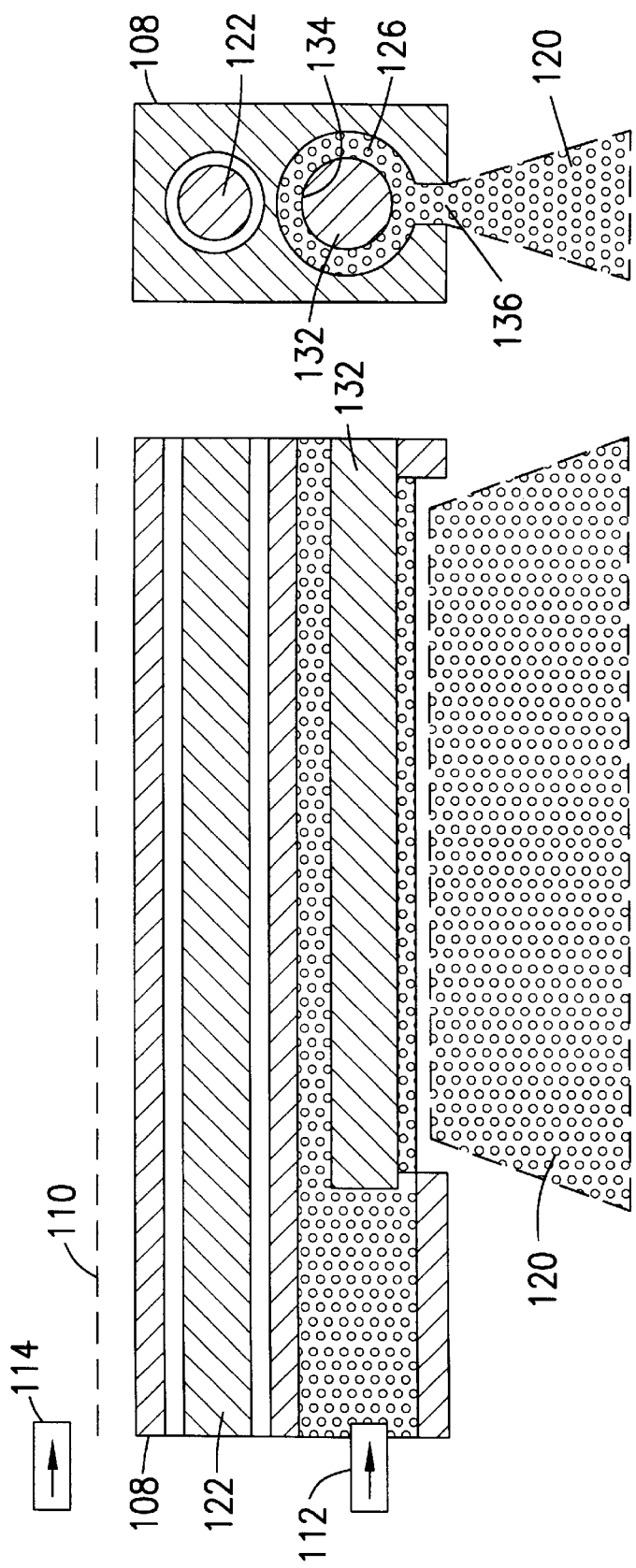
FIGS. 4A and 4B are planar and cross-sectional views, respectively, of a reactant gas distributor, in accordance with an embodiment of the present invention.

Each of the chambers 150, 152, and 154 in the example of FIG. 3 includes a reactant gas distributor (RGD) 108 for the deposition of organic precursor materials, as shown in detail in FIGS. 4A and 4B. RGD's 108 are used as an alternative to the organic precursor delivery mechanisms of FIGS. 1 and 2, and are used to provide gas curtains, 120, 120', 120" and 120"'. RGD 108 ensures that where multiple organic precursors are deposited, the precursors remain separated until deposited on a substrate, whereupon reaction of the precursors is permitted to take place. RGD 108 includes heater 122, second carrier gas inlet 112 and gas manifold 132. Heater 122 prevents the premature condensation of organic precursor materials. Over RGD 108 is a first carrier gas inlet 114 and distributor plate 110. First carrier gas inlet 114 supplies gas which usually carries a first organic precursor of generally low volatility such as, for example, MT. The first carrier gas enters a reaction chamber though distributor plate 110, which is a wire mesh, a glass filter material, or a porous stainless steel plate, for example. The column of carrier gas flowing through distributor plate 110 is shadowed by the RGD 108. RGD 108 provides a planar gas curtain 120 of a second organic precursor of generally low vapor pressure such as, for example, DAS. A second carrier gas containing a second organic precursor enters at inlet 112 and is directed into gas manifold 132. Manifold 132 is a hollow tube having a line of holes 134 for feeding the second carrier has into an annular cavity 126, which surrounds manifold 132. Second carrier gas exits RGD 108 through slit 136, thus giving it the shape of a planar curtain.

As an example, curtain 120 is comprised of TPD vapors, curtain 120' is comprised of $Alq_3$ vapors and curtain 120" is comprised of vapors such as a polypyrole or metallorganic compounds that produce a conductive surface. If desired, control or tuning of the color of light emitted by an OLED can be effected by suitable doping of the $Alq_3$ layer with an additional RGD device 108 in the chamber 152 that produces a curtain 120"' of dopant vapor.

Figure 5:
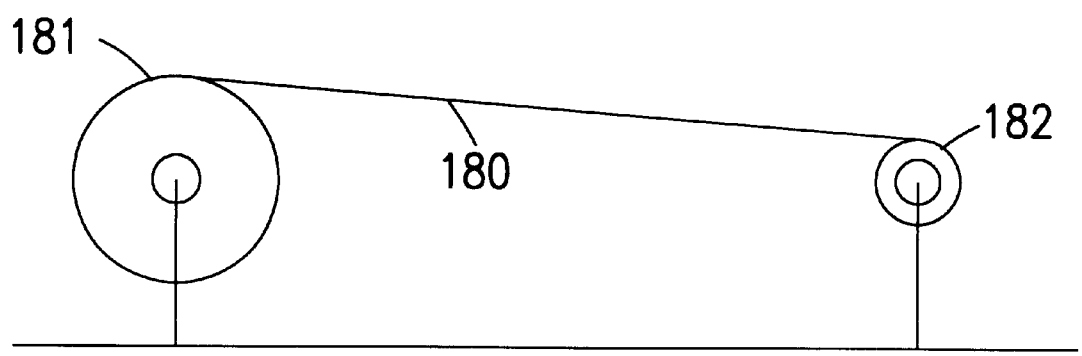
FIG. 5 is a side view of a roll-to-roll substrate delivery mechanism, in accordance with an embodiment of the present invention.

The apparatus of FIG. 1, FIG. 2 or FIG. 3 is optionally modified by using a "roll-to-roll" substrate delivery system, as shown in FIG. 5. The delivery system shown in FIG. 5 is suitable for the deposition of organic thin films onto large area, flexible substrates. Substrate 180 is made of a polymer sheet or metal foil, for example, and is delivered from roll 181 to roll 182. The deposition of organic precursors onto substrate 180 occurs when substrate 180 is unrolled from roll 181 and is therefore exposed to the reaction chamber of FIG. 1, or when exposed to the molecular beam or curtains of FIGS. 2 and 3, respectively. Rolls 181 and 182 are driven by any suitable means, such as a variable speed motor. The speed at which substrate 180 is passed from roll 181 to roll 182 dictates the thickness of the organic film that forms on substrate 180.

The present invention is further described with reference to the following non-limiting examples.

EXAMPLE 1

Using the apparatus of FIG. 1, layers of organic light emitting materials were grown using glass and flexible polyester substrates precoated with transparent layers of indium tin oxide (ITO). The ITO forms the anode of the device with a thickness of 1700 Å and 1200 Å for the glass and polyester substrates, respectively, yielding anode resistances of 10 Ω and 60 Ω, respectively. Glass substrates were cleaned by rinsing in a solution of detergent and deionized water in an ultrasonic bath, and then boiling in 1,1,1-trichloroethane, rinsing in acetone and finally rinsing in 2-propanol. To avoid damage due to exposure to organic solvents, the flexible substrates were cleaned by rinsing only in the detergent and 2-propanol solutions.

Glass substrates were placed within the reactor tube 12 at a location where the temperature was approximately 220° C. The first layer deposited on the ITO surface was TPD, a hole transporting material. Specifically, TPD vapor was carried from crucible 14 to substrate 58 via nitrogen carrier gas. The TPD growth conditions included a source temperature of 200±5° C., a nitrogen carrier gas flow rate of 100 sccm, a reactor pressure of 0.50 Torr and a growth time of 20 minutes. At a nitrogen flow rate of 100 sccm, the Reynolds number of the system was ~500, indicating operation well within the laminar flow regime. The TPD layer was grown to a thickness of between 100–300 Å.

After deposition, the temperature near the TPD crucible was reduced, and the corresponding nitrogen flow was shut off. Next, an electron transporting layer of $Alq_3$ was grown by turning on a separate nitrogen line to carry $Alq_3$ vapor from crucible 14N into chamber 12. The $Alq_3$ growth conditions included a source temperature of 247±8° C., a nitrogen flow rate of 50 sccm, a pressure of 0.65 Torr and a growth time of 10 minutes. During the deposition of both the TPD and $Alq_3$, the substrate was maintained at 15° C. using a water cooled stainless steel substrate holder. The TPD layer was grown to a thickness of between 700–1100 Å.

After deposition of the $Alq_3$ layer, the substrate was removed from the reactor and a Mg:Ag top contact was applied by thermal evaporation. The contact was completed with the evaporation of a 1000 Å thick protective Ag layer.

The use of low pressures during deposition resulted in organic layers having smooth and uniform surfaces. For example, the TPD and $Alq_3$ layers were measured via atomic force microscopy to have RMS roughnesses of 6–8 Å and 9–11 Å, respectively. The resulting OLED devices exhibited current-voltage characteristics wherein I V at low voltages and I $V^9$ at higher voltages. The turn-on voltage, $V_T$, at which the power law dependence of I on V changed, was about 6V.

EXAMPLE 2

An NLO film was prepared using the apparatus shown in FIG. 1. MT 48 was loaded into a 30 $cm^3$ bubbler 46, the temperature of which was maintained at approximately 80°–100° C. by silicone oil bath 50. Nitrogen gas was used to bubble through the MT 48, thereby carrying MT vapor through glass tube 54 and into reactor tube 12 at a location approximately 5 cm beyond crucible 14, which contained was placed on the floor of reactor tube 12 and DASI. The pressure within reactor tube 12 was maintained at about $10^{-2}$ torr. DAS vapor reacted with the MT vapor to form a solid film of DAST on substrates 58, which were supported on substrate block 60. Excess unreacted MT vapor and any volatile side-reaction products were exhausted from exhaust tube 62. DAST films thus formed are useful as optical switches, for example.

The present invention makes use of low pressure deposition techniques to produce organic thin films having superior surface properties and accurate and precise compositions. Although various embodiments of the invention are shown and described herein, they are not meant to be limiting. For example, those of skill in the art may recognize certain modifications to these embodiments, which modifications are meant to be covered by the spirit and scope of the appended claims.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996), now U.S. Pat. No. 6,046,543; "Novel Materials for Multicolor LED's", Ser. No. 08/850,264 (filed May 2, 1997), now U.S. Pat. No. 6,045,930; "Electron Transporting and Light Emitting Layers Based on Organic Free Radicals", Ser. No. 08/774,120 (filed Dec. 23, 1996), now U.S. Pat. No. 5,811,833; "Multicolor Display Devices", Ser. No. 08/772,333 (filed Dec. 23, 1996), now U.S. Pat. No. 6,013,982; "Red-Emitting Organic Light Emitting Devices (LED's)", Ser. No. 08/774,087 (filed Dec. 23, 1996), now U.S. Pat. No. 6,048,630; "Driving Circuit For Stacked Organic Light Emitting Devices", Ser. No. 08/792,050 (filed Feb. 3, 1997), now U.S. Pat. No. 5,757,139; "High Efficiency Organic Light Emitting Device Structures", Ser. No. 08/772,332 (filed Dec. 23, 1996), now U.S. Pat. No. 5,834,893; "Vacuum Deposited, Non-Polymeric Flexible Organic Light Emitting Devices", Ser. No. 08/789,319 (filed Jan. 23, 1997), now U.S. Pat. No. 5,844,363; "Displays Having Mesa Pixel Configuration", Ser. No. 08/794 595 (filed Feb. 3, 1997), now U.S. Pat. No. 6,091,195; "Stacked Organic Light Emitting Devices", Ser. No. 08/792,046 (filed Feb. 3, 1997), now U.S. Pat. No. 5,917,280; "High Contrast Transparent Organic Light Emitting Device Display", Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material", Ser. No. 08/838,099 (filed Apr. 14, 1997), now U.S. Pat. No. 5,861,219; "Light Emitting Devices Having High Brightness", Ser. No. 08/844,353 (filed Apr. 18, 1997), now U.S. Pat. No. 6,125,226; "Organic Semiconductor Laser", Ser. No. 60/046,061 (filed May 9, 1997); "Organic Semiconductor Laser", Ser. No. 08/859,468 (filed May 19, 1997), now U.S. Pat. No. 6,111,902; "Saturated Full Color Stacked Organic Light Emitting Devices", Ser. No. 08/858,994 (filed May 20, 1997), now U.S. Pat. No. 5,932,895; "An Organic Light Emitting Device Containing a Hole injection Enhancement Layer", Ser. No. 08/865,491 (filed May 29, 1997), now U.S. Pat. No. 5,998,803; "Plasma Treatment of Conductive Layers", Ser. No. PCT/US97/10252; (filed Jun. 12, 1997); "Patterning of Thin Films for the Fabrication of Organic Multi-Color Displays", Ser. No. PCT/US97/10289 (filed Jun. 12, 1997); "Double Heterostructure Infrared and Vertical Cavity Surface Emitting Organic Lasers", Ser. No. 60/053,176 (filed Jul. 18, 1997); "Oleds Containing Thermally Stable Asymmetric Charge Carrier Materials", Ser. No. 08/929,029 (filed Sep. 8, 1997); "Light Emitting Device with Stack of Oleds and Phosphor Downconverter", Ser. No. 08/925,403 (filed Sep. 9, 1997), now U.S. Pat. No. 5,874,803; "An Improved Method for Depositing Indium Tin Oxide Layers in Organic Light Emitting Devices", Ser. No. 08/928,800 (filed Sep. 12, 1997), now U.S. Pat. No. 5,981,306; "Azlactone-Related Dopants in the Emissive Layer of an Oled" Ser. No. 08/948,130 (filed Oct. 9, 1997), now U.S. Pat. No. 6,030,715; "A Highly Transparent Organic Light Emitting Device Employing a Non-Metallic Cathode", (filed Nov. 3, 1997), Attorney Docket No. 10020/40 (Provisional), now U.S. Provisional Application No. 60/064,005; and "A Highly Transparent Organic Light Emitting Device Employing a Non-Metallic Cathode", (filed Nov. 5, 1997), Attorney Docket No. 10020/44, now U.S. Ser. No. 08/964,863; each co-pending application being incorporated herein by reference in its entirely. The subject invention may also be used in conjunction with the subject matter of each of U.S. patent application Ser. Nos. 08/354,674, now U.S. Pat. No. 5,707,745, Ser No. 08/613,207, now U.S. Pat. No. 5,703,436, Ser No. 08/632,322 now U.S. Pat. No. 5,757,026, and Ser No. 08/693,359 and provisional patent application Ser. Nos. 60/010,013, to which non-provisional U.S. application Ser. No. 08/779,141 filed Jan. 6, 1997 claimed benefit, now U.S. Pat. No. 5,986,268, Ser No. 60/024,001 to which non-provisional U.S. application Ser. No. 08/789,319 filed Jan. 23, 1997 claimed benefit, now U.S. Pat. No. 5,844,363, and Ser No. 60/025,501, to which non-provisional U.S. application Ser. No. 08/844,353 filed Apr. 18, 1997 claimed benefit, now U.S. Pat. No. 6,125,226 each of which is also incorporated herein by reference in its entirety.

What is claimed is:

1. A method for fabricating organic films comprising:
   providing a first carrier gas stream;
   volatilizing a first organic small molecule material into the first carrier gas stream;
   passing the first carrier gas stream through an apparatus;
   maintaining the wall temperature of the apparatus at a sufficiently high temperature to avoid condensation of the volatilized first organic small molecule material;
   passing the first carrier gas stream at a pressure of about 0.001 torr to about 100 torr over a substrate; and
   depositing said first organic small molecule material on said substrate so as to form a first film comprising the first organic small molecule material on said substrate.

2. The method of claim 1, wherein said pressure is from about 0.1 torr to about 10 torr.

3. The method of claim 1, wherein said wherein said carrier gas is selected from the group consisting of nitrogen, argon, helium, neon, krypton and xenon.

4. The method of claim 1, wherein said first organic small molecule material is selected from the group consisting of tris(8-quinoline)aluminum; N,N'-diphenyl-N-N'-bis(3-methylphenyl)-1,1'-bisphenyl-4,4'-diamine; α-4,4'-bis[N-(1-naphthyl)-N-phenyl-amino]biphenyl; 4,4',4"-tris[N-(3-methylphenyl)-N-phenylamino]triphenylamine; and bis-(8-hydroxyquinoline)aluminum oxyphenyl.

5. The method of claim 1, wherein the first film comprises N,N'-diphenyl-N-N'-bis(3-methylphenyl)-1,1'-bisphenyl-4,4'-diamine.

6. The method of claim 1, wherein said method further comprises:
   volatilizing a second organic small molecule material into a second carrier gas stream; and
   combining the second carrier gas stream with the first carrier gas stream;
   wherein said depositing includes depositing said second organic small molecule material along with said first organic small molecule material on said substrate such that said first film comprises the first organic small molecule material and the second organic small molecule material.

7. The method of claim 6, wherein said pressure is from about 0.1 torr to about 10 torr.

8. The method of claim 6, wherein the first film is incorporated into an organic light emitting device.

9. The method of claim 1 wherein said method further comprises:
   volatilizing a third organic small molecule material into a third carrier gas stream;
   passing the third carrier gas stream at a pressure of about 0.001 torr to about 100 torr over the first film; and depositing said third organic small molecule material over said first film so as to form a second film comprising the third organic small molecule material over said first film.

10. The method of claim 9, wherein said pressure of the third carrier gas stream is from about 0.1 torr to about 10 torr.

11. The method of claim 9, wherein said first and second films are incorporated into an organic light emitting device.

12. The method of claim 9, wherein the second film comprises tris(8-quinoline)aluminun.

13. The method of claim 1, wherein said first film comprises $Alq_3$ having an RMS surface roughness of from 9 to 11 angstroms.

14. The method of claim 1, wherein said first film comprises TPD having an RMS surface roughness of from 6 to 8 angstroms.

15. A method for fabricating organic films comprising:

providing a first carrier gas stream comprising one or more volatilized first organic small molecule materials;

passing the first carrier gas stream through a first apparatus;

maintaining the wall temperature of the first apparatus at a sufficiently high temperature to avoid condensation of the one or more volatilized first organic small molecule materials;

exposing the first carrier gas stream at a pressure of about 0.001 torr to about 100 torr to a substrate;

depositing the one or more volatilized first organic small molecule materials on said substrate so as to form a first film on said substrate, said first film comprising the one or more first organic small molecule materials;

providing a second carrier gas stream comprising one or more volatilized second organic small molecule materials;

passing the second carrier gas stream through a second apparatus;

maintaining the wall temperature of the second apparatus at a sufficiently high temperature to avoid condensation of the one or more volatilized second organic small molecule materials;

exposing the second carrier gas stream at a pressure of about 0.001 torr to about 100 torr to said first film on said substrate; and depositing the one or more volatilized second organic small molecule materials on said first film so as to form a second film on said first film on said substrate, said second film comprising said one or more second organic small molecule materials.

16. The method of claim 15, wherein said one or more first organic small molecule materials comprise a single first organic small molecule material.

17. The method of claim 15, wherein said one or more first organic small molecule materials comprise two or more first organic small molecule materials.

18. The method of claim 15, wherein said one or more second organic small molecule materials comprise a single second organic small molecule material.

19. The method of claim 15, wherein said one or more second organic small molecule materials comprise two or more second organic small molecule materials.

20. The method of claim 15, wherein said first and second films are incorporated into an organic light emitting device.

21. The method of claim 20, wherein one of said first and second films is a light emitting layer.

22. The method of claim 21, wherein said light emitting layer comprises tris(8-quinoline)aluminum.

23. The method of claim 20, wherein one of said first and second films is a hole transporting layer.

24. The method of claim 23, wherein said hole transporting layer comprises N,N'-diphenyl-N-N'-bis(3-methylphenyl)-1,1'-bisphenyl-4,4'-diamine.

25. The method of claim 20, wherein one of said first and second films is a light emitting layer and the other of said first and second films is a hole transporting layer.

26. The method of claim 25, wherein said light emitting layer comprises tris(8-quinoline)aluminum and said hole transporting layer comprises N,N'-diphenyl-N-N'-bis(3-methylphenyl)-1,1'-bisphenyl-4,4'-diamine.

27. The method of claim 15, wherein said substrate comprises a polymer film material, a glass material or a semiconductor material.

28. The method of claim 15, wherein said substrate comprises a layer of indium tin oxide.

29. The method of claim 28, wherein said substrate is polyester coated with indium tin oxide.

30. A method for fabricating organic films comprising:

providing a carrier gas stream comprising one or more volatilized first organic small molecule materials;

exposing the carrier gas stream at a pressure of about 0.001 torr to about 100 torr to a substrate; and depositing the one or more volatilized first organic small molecule materials on said substrate so as to form a first film on said substrate, said first film comprising the one or more first organic small molecule materials;

wherein said carrier gas stream is passed through an apparatus in which inside walls of said apparatus are sufficiently elevated to prevent condensation of the one or more first organic small molecule materials before the depositing step.

31. The method of claim 30, wherein said film is a light emitting layer.

32. The method of claim 31, wherein said film comprises a single first organic small molecule material.

33. The method of claim 31, wherein said film comprises two or more first organic small molecule materials.

34. The method of claim 31, wherein said pressure is from about 0.1 torr to about 10 torr.

35. The method of claim 31, wherein said pressure is from about 0.001 torr to about 0.1 torr.

36. The method of claim 31, wherein said pressure is from about 0.001 torr to about 10 torr.

37. The method of claim 31, wherein said pressure is from about 0.1 torr to about 100 torr.

38. The method of claim 36, wherein said pressure is from about 10 torr to about 100 torr.

39. The method of claim 31, wherein said substrate is cooled.

40. The method of claim 31, wherein said substrate comprises a polymer film material, a glass material or a semiconductor material.

41. The method of claim 31, wherein said substrate comprises a layer of indium tin oxide.

42. The method of claim 31, wherein said substrate is polyester coated with indium tin oxide.

43. The method of claim 31, wherein said substrate is polyester coated with indium tin oxide, which is further coated with a hole transporting layer.

* * * * *

UNITED STATES PATENT AND TRADEMARK OFFICE
CERTIFICATE OF CORRECTION

PATENT NO.   : 6,337,102 B1
DATED        : January 8, 2002
INVENTOR(S)  : Forrest et al.

It is certified that error appears in the above-identified patent and that said Letters Patent is hereby corrected as shown below:

Column 4,
Line 37, change "Freon" to -- freon --;

Column 5,
Table, under the "Film Material" column, at the seventh and fourth lines from the bottom of the table, change "4'-dimethylamino-N-" to -- 4'dimethylamino-4- --;

Column 8,
Line 48, change "I V" to -- I$\propto$V --;
Line 49, change "I V$^9$" to -- I$\propto$V$^9$ --;

Column 10,
Line 4, insert -- co-pending -- before "U.S. patent"; and

Column 12,
Line 52, change "36" to -- 31 --.

Signed and Sealed this

Third Day of September, 2002

*Attest:*

JAMES E. ROGAN
*Director of the United States Patent and Trademark Office*

*Attesting Officer*